US006633114B1

(12) United States Patent
Houk et al.

(10) Patent No.: US 6,633,114 B1
(45) Date of Patent: Oct. 14, 2003

(54) MASS SPECTROMETER WITH ELECTRON SOURCE FOR REDUCING SPACE CHARGE EFFECTS IN SAMPLE BEAM

(75) Inventors: Robert S. Houk, Ames, IA (US); Narong Praphairaksit, Bangkok (TH)

(73) Assignee: Iowa State University Research Foundation, Inc., Ames, IA (US)

( * ) Notice: Subject to any disclaimer, the term of this patent is extended or adjusted under 35 U.S.C. 154(b) by 429 days.

(21) Appl. No.: 09/758,391

(22) Filed: Jan. 12, 2001

Related U.S. Application Data

(60) Provisional application No. 60/175,688, filed on Jan. 12, 2000.

(51) Int. Cl.[7] .......................... H01J 37/05; H01J 49/06

(52) U.S. Cl. .................... 313/359.1; 250/281; 250/282; 250/423 R; 250/424; 250/251

(58) Field of Search ................................ 250/281, 282, 250/423 R, 424, 251; 313/359.1

(56) References Cited

U.S. PATENT DOCUMENTS 5,136,171 A * 8/1992 Leung et al. ............ 250/492.2
6,515,408 B1 * 2/2003 England et al. .......... 313/359.1

OTHER PUBLICATIONS

K. Hu et al., "Inductively Coupled Plasma Mass Spectrometry with an Enlarged Sampling Orifice and Offset Ion Lens. I. Ion Trajectories and Detector Performance", *Journal of the American Society for Mass Spectrometry*, vol. 4, 1993, pp. 16–27.

K. Hu et al., "Inductively Coupled Plasma Mass Spectrometry with an Enlarged Sampling Orifice and Offset Ion Lens. II. Polyatomic Ion Interferences and Matrix Effects", *Journal of the American Society for Mass Spectrometry*, vol. 4, 1993, pp. 28–37.

S. Tanner et al., "Reduction of Space Charge Effects Using a Three–Aperture Gas Dynamic Vacuum Interface for Inductively Coupled Plasma–Mass Spectrometry", *Applied Spectrscopy*, vol. 48, No. 11, 1994, pp. 1367–1372.

E. Denoyer et al., "Determination of Trace Elements in Uranium: Practical Benefits of a New ICP/MS Lens System", *Atomic Spectroscopy*, vol. 16, No. 1, Jan./Feb. 1995, pp. 1–6.

H. Niu et al., "Fundamental aspects of ion extraction in inductively coupled plasma mass spectrometry", *Spectrochimica Acta Part B*, vol. 51, 1996, pp. 779–815.

N. Praphairaksit et al., "Reduction of Space Charge Effects in Inductively Coupled Plasma Mass Spectrometry Using a Supplemental Electron Source inside the Skimmer: Ion Transmission and Mass Spectral Characteristics", *Analytical Chemistry*, vol. 72, No. 11, Jun. 1, 2000, pp. 2356–2361.

N. Praphairaksit et al., "Attenuation of Matrix Effects in Inductively Coupled Plasma Mass Spectrometry with a Supplemental Electron Source inside the Skimmer", *Analytical Chemistry*, vol. 72, No. 11, Jun. 1, 2000, pp. 2351–2355.

N. Praphairaksit et al., "Reduction of Mass Bias and Matrix Effects in Inductively Coupled Plasma Mass Spectrometry with a Supplemental Electron Source in a Negative Extraction Lens", *Analytical Chemistry*, vol. 72, No. 18, Sep. 15, 2000, pp. 4435–4440.

* cited by examiner

*Primary Examiner*—Nikita Wells
(74) *Attorney, Agent, or Firm*—Antonelli, Terry, Stout & Kraus, LLP

(57) ABSTRACT

A mass spectrometer includes an ion source which generates a beam including positive ions, a sampling interface which extracts a portion of the beam from the ion source to form a sample beam that travels along a path and has an excess of positive ions over at least part of the path, thereby causing space charge effects to occur in the sample beam due to the excess of positive ions in the sample beam, an electron source which adds electrons to the sample beam to reduce space charge repulsion between the positive ions in the sample beam, thereby reducing the space charge effects in the sample beam and producing a sample beam having reduced space charge effects, and a mass analyzer which analyzes the sample beam having reduced space charge effects.

66 Claims, 5 Drawing Sheets

MASS SPECTROMETER WITH ELECTRON SOURCE FOR REDUCING SPACE CHARGE EFFECTS IN SAMPLE BEAM

CROSS-REFERENCE TO RELATED APPLICATION

This application claims the benefit of U.S. provisional application Ser. No. 60/175,688 filed on Jan. 12, 2000.

STATEMENT REGARDING FEDERALLY SPONSORED RESEARCH OR DEVELOPMENT

Development of the present invention was federally funded under U.S. Department of Energy Contract No. W-7405-Eng-82.

The present invention is described in the following three papers published by the applicants.

The first paper is N. Praphairaksit et al., "Reduction of Space Charge Effects in Inductively Coupled Plasma Mass Spectrometry Using a Supplemental Electron Source inside the Skimmer: Ion Transmission and Mass Spectral Characteristics", *Analytical Chemistry*, Vol. 72, No. 11, Jun. 1, 2000, pp. 2356–2361 (the Praphairaksit I paper). An earlier version of this paper is included in U.S. provisional application Serial No. 60/175,688 referred to above as Appendix I.

The second paper is N. Praphairaksit et al., "Attenuation of Matrix Effects in Inductively Coupled Plasma Mass Spectrometry with a Supplemental Electron Source inside the Skimmer", *Analytical Chemistry*, Vol. 72, No. 11, Jun. 1, 2000, pp. 2351–2355 (the Praphairaksit II paper). An earlier version of this paper is included in U.S. provisional application Serial No. 60/175,688 referred to above as Appendix II.

The third paper is N. Praphairaksit et al., "Reduction of Mass Bias and Matrix Effects in Inductively Coupled Plasma Mass Spectrometry with a Supplemental Electron Source in a Negative Extraction Lens", *Analytical Chemistry*, Vol. 72, No. 18, Sep. 15, 2000, pp. 4435–4440 (the Praphairaksit III paper). An earlier version of this paper is included in U.S. provisional application Serial No. 60/175,688 referred to above as Appendix III.

The Praphairaksit I, Praphairaksit II, and Praphairaksit III papers referred to above are incorporated herein by reference in their entirety.

BACKGROUND OF THE INVENTION

1. Field of the Invention

The present invention is directed to mass spectrometers, and in particular to mass spectrometers wherein space charge effects occur in a sample beam due to an excess of positive ions in the sample beam. The present invention is particularly useful in inductively coupled plasma-mass spectrometers (ICP-MS).

2. Description of the Related Art

FIG. 1 shows a prior-art mass spectrometer which is basically the same as that described in K. Hu et al., "Inductively Coupled Plasma Mass Spectrometry with an Enlarged Sampling Orifice and Offset Ion Lens. I. Ion Trajectories and Detector Performance", *Journal of the American Society for Mass Spectrometry*, Vol. 4, 1993, pp. 16–27 (the Hu I reference), and K. Hu et al., "Inductively Coupled Plasma Mass Spectrometry with an Enlarged Sampling Orifice and Offset Ion Lens. II. Polyatomic Ion Interferences and Matrix Effects", *Journal of the American Society for Mass*

*Spectrometry*, Vol. 4, 1993, pp. 28–37 (the Hu II reference). One of the authors of the Hu I and Hu II references, Robert S. Houk, is also one of the applicants of the present application. The Houk I and Houk II references are incorporated herein by reference in their entirety.

The prior-art mass spectrometer in FIG. 1 includes an ion source 1, a sampling interface 2, and a mass analyzer 3.

In the Hu I and Hu II references, ion source 1 is an inductively coupled plasma ion source, and mass analyzer 3 is a quadrupole mass analyzer.

Sampling interface 2 includes a sampler 4, a skimmer 5, an ion lens 6, and a differential pumping plate 7. Ion lens 6 includes seven electrodes 8, 9, 10, 11, 12, 13, and 14, which are typically DC electrodes.

In the Hu I and Hu II references, a positive voltage +V1 is applied to a first electrode 8 of ion lens 7, meaning a voltage that is more positive than a potential of skimmer 5.

First electrode 8 may be a cylindrical electrode having holes in it as indicated by the dashed lines in FIG. 1, and may be formed of a mesh.

Ion source 1 generates a quasineutral beam 15 of positive ions and electrons wherein the total positive charge of the positive ions is substantially equal to the total negative charge of the electrons. Sampling interface 2 extracts a portion of quasineutral beam 15 to form a sample beam 16 which is analyzed by mass analyzer 3.

Quasineutral beam 15 and sample beam 16 are shown schematically in FIG. 1 as a single line representing the center lines of these two beams. The shapes of quasineutral beam 15 and sample beam 16 and the trajectories of the positive ions and the electrons in these two beams are described in the Hu I and Hu II references, and elsewhere in the prior art, for example, in H. Niu et al., "Fundamental aspects of ion extraction in inductively coupled plasma mass spectrometry", *Spectrochimica Acta Part B*, Vol. 51, 1996, pp. 779–815 (the Niu reference). One of the authors of the Niu reference, Robert S. Houk, is also one of the applicants of the present application. The Niu reference is incorporated herein by reference in its entirety.

As sample beam 16 passes through sampler 4 and skimmer 5, it is initially a quasineutral beam of positive ions and electrons wherein the total positive charge of the positive ions is substantially equal to the total negative charge of the electrons. However, as sample beam 16 travels downstream from skimmer 5 towards ion lens 6, it changes to a positively charged beam with an excess of positive ions, causing space charge effects to develop in sample beam 16. The reasons for this are described in detail in the Praphairaksit I and Praphairaksit II papers and the Hu I, Hu II, and Niu references.

However, a simplified explanation of the reasons for this is that electrons diffuse away from sample beam 16 as it travels downstream from skimmer 5 towards ion lens 6, creating an excess of positive ions in sample beam 16 and causing sample beam to become positively charged. This causes a space charge field to develop in sample beam 16, thereby causing space charge effects to develop in sample beam 16 as it travels downstream from skimmer 5 towards ion lens 6. Other fundamental reasons for preferential loss of electrons, in place of or in addition to diffusion, are also possible.

The space charge effects which develop in sample beam 16 have numerous disadvantages, and adversely affect the performance of the prior-art mass spectrometer in FIG. 1 as described in detail in the Praphairaksit I, Praphairaksit II, and Praphairaksit III papers and the Niu reference.

FIG. 2 is a diagram showing some consequences of these space charge effects, wherein (−) denotes electrons, (+) denotes light analyte ions, such as Li, and (+) denotes heavy analyte ions, such as U. As shown in FIG. 2, the electrons (−) diffuse away from sample beam 16 as it travels downstream from skimmer 5 towards ion lens 6, creating an excess of positive ions in sample beam 16 and causing sample beam 16 to become positively charged.

For the reasons discussed in detail in the Praphairaksit I, Praphairaksit II, and Praphairaksit III papers and the Niu reference, this causes sample beam 16 to defocus as it travels downstream from skimmer 5 towards ion lens 6, decreasing the number of the light analyte ions (+) and the heavy analyte ions (+) which are available to enter first electrode 8 of ion lens 6. Also, this causes the light analyte ions (+) to defocus to a greater extent than the heavy analyte ions (+), such that the ratio of the abundance (or number density) of the light analyte ions (+) to the abundance of the heavy analyte ions (+) in the portion of sample beam 16 which actually enters first electrode 8 of ion lens 6 is less than the actual ratio of the abundance of the light analyte ions (+) to the abundance of the heavy analyte ions (+) in sample beam 16 where it enters skimmer 5. These effects are particularly troublesome when attempting to measure a small amount of a light element such as Li, in a matrix of a heavy element, such as U, especially when ion source 1 has a high temperature which induces a large variation of ion kinetic energy with ion mass and/or ion mass-to-charge ratio, as described in the Niu reference.

One method of reducing space charge effects in a mass spectrometer is disclosed in S. Tanner et al., "Reduction of Space Charge Effects Using a Three-Aperture Gas Dynamic Vacuum Interface for Inductively Coupled Plasma-Mass Spectrometry", *Applied Spectroscopy*, Vol. 48, No. 11, 1994, pp. 1367–1372. This method uses a three-aperture sampling interface including a sampler, a skimmer downstream from the sampler, and a third aperture downstream from the skimmer which is offset from a beam axis defined by apertures in the sampler and the skimmer.

Another method of reducing space charge effects in a mass spectrometer is disclosed in E. Denoyer et al., "Determination of Trace Elements in Uranium: Practical Benefits of a New ICP-MS Lens System", *Atomic Spectroscopy*, Vol. 16, No. 1, January/February 1995, pp. 1–6. This method uses a sampling interface including a sampler, a skimmer downstream from the sampler, a grounded shadow stop downstream from the skimmer, and a single cylindrical ion lens downstream from the shadow stop. A voltage applied to the ion lens is dynamically varied in accordance with the mass-to-charge ratio of the ion being analyzed.

The applicants of the present application have invented another method of reducing space charge effects in a mass spectrometer which involves adding electrons to a sample beam having an excess of positive ions to reduce space charge repulsion between the positive ions in the sample beam, thereby reducing space charge effects in the sample beam and producing a sample beam having reduced space charge effects.

BRIEF SUMMARY OF THE INVENTION

The present invention is directed to a mass spectrometer including an ion source which generates a beam including positive ions, a sampling interface which extracts a portion of the beam from the ion source to form a sample beam that travels along a path and has an excess of positive ions over at least part of the path, thereby causing space charge effects to occur in the sample beam due to the excess of positive ions in the sample beam, an electron source which adds electrons to the sample beam to reduce space charge repulsion between the positive ions in the sample beam, thereby reducing the space charge effects in the sample beam and producing a sample beam having reduced space charge effects, and a mass analyzer which analyzes the sample beam having reduced space charge effects.

DETAILED DESCRIPTION OF THE INVENTION

Figure 1:
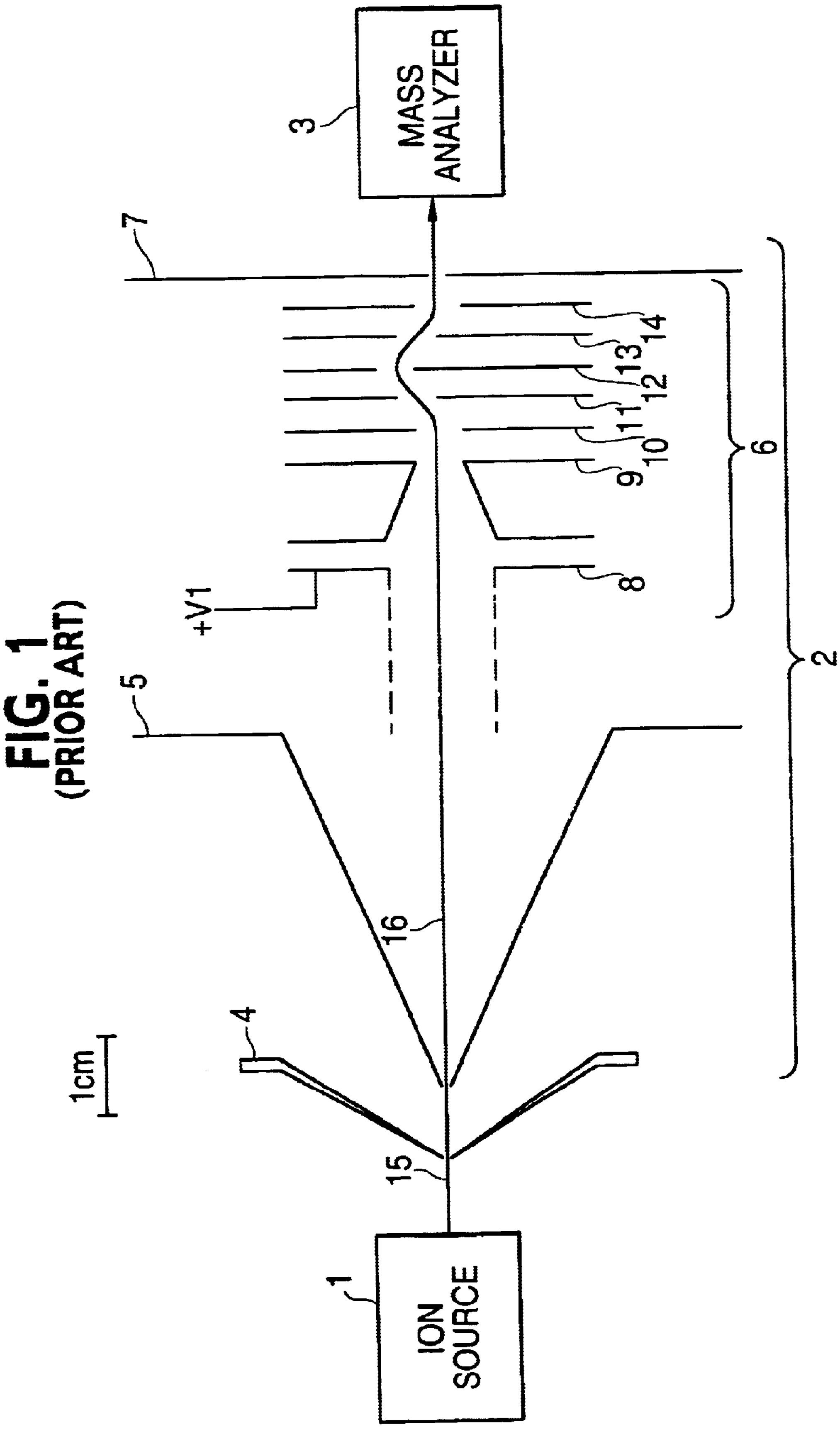
FIG. 1 (PRIOR ART)
FIG. 1 shows an example of a prior-art mass spectrometer.

The present invention will now be described with reference to the accompanying drawings, wherein like parts are identified by like reference numerals.

Figure 3:
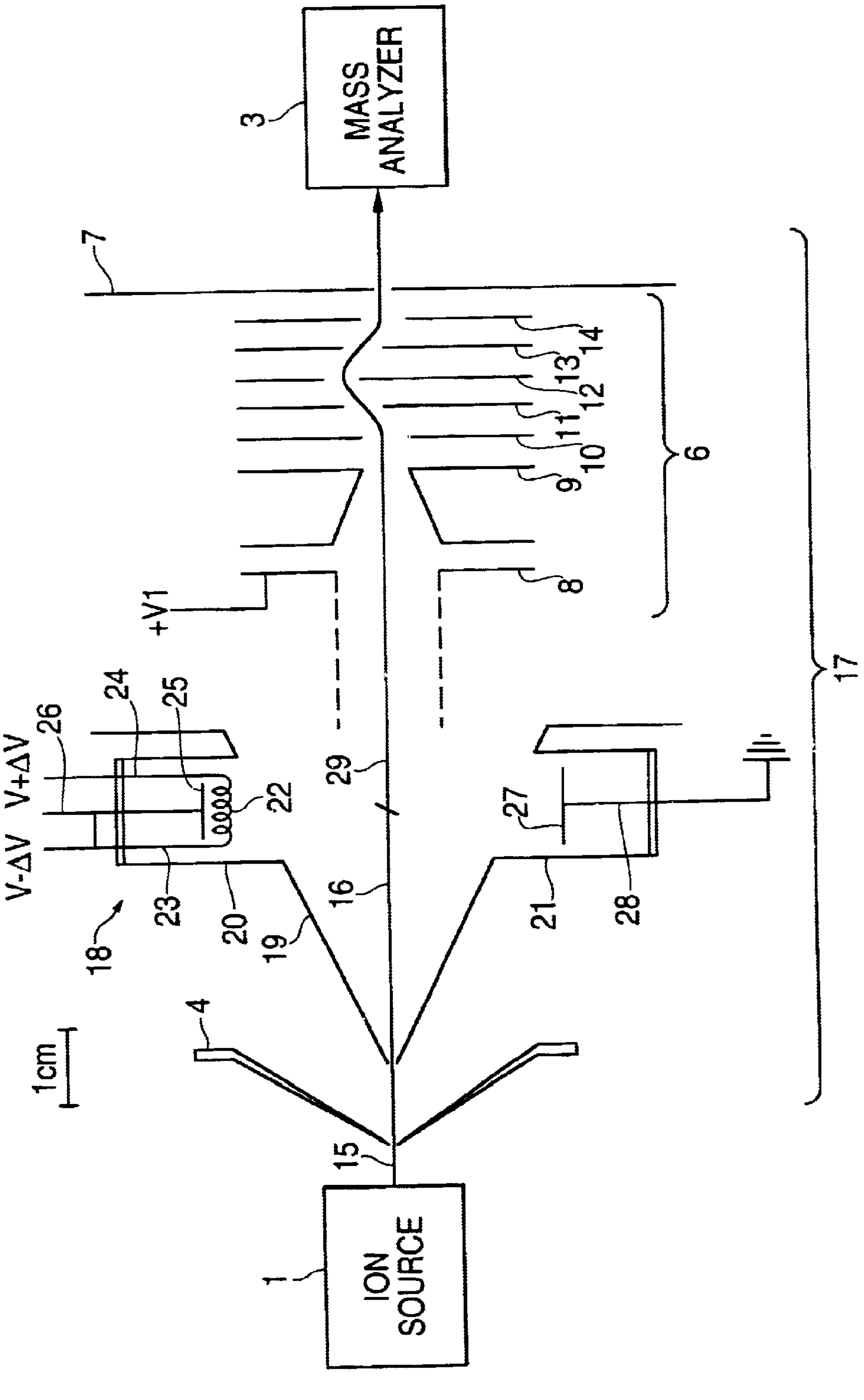
FIG. 3 shows an example of a mass spectrometer according to the present invention in which a voltage that is more positive than a potential of a skimmer is applied to a first electrode of an ion lens.

FIG. 3 shows an example of a mass spectrometer according to the present invention which is a modification of the prior-art mass spectrometer in FIG. 1 wherein sampling interface 2 in FIG. 1 is replaced with a sampling interface 17. Sampling interface 17 in FIG. 3 is basically the same as sampling interface 2 in FIG. 1, except that skimmer 4 in FIG. 1 is replaced with a skimmer 18 including a skimmer cone 19 as shown in FIG. 3. As in FIG. 1, a positive voltage +V1 is applied to first electrode 8 of ion lens 6, meaning a voltage that is more positive than a potential of skimmer cone 19.

Skimmer 18 also includes a first side port 20 and a second side port 21. A coiled tungsten filament 22 constituting an electron source according to the present invention is disposed in first side port 20. A first end of tungsten filament 22 is connected to a first electrical feedthrough 23 to which a voltage $V-\Delta V$ is applied, and a second end of tungsten filament 22 is connected to a second electrical feedthrough 24 to which a voltage $V+\Delta V$ is applied. The voltage difference $2\Delta V$ between voltages $V-\Delta V$ and $V+\Delta V$ causes a current to flow through tungsten filament 22, which causes tungsten filament 22 to emit electrons. The average voltage V of voltages $V-\Delta V$ and $V+\Delta V$ is preferably small enough that the electrons which are emitted from tungsten filament 22 do not have enough energy to create additional ions in sample beam 16. However, average voltage V may also be adjusted to enhance production of ions from atoms or molecules extracted from ion source 1 inside skimmer 18, if desired.

Skimmer 18 further includes an electron repeller 25 constituted by a metal plate disposed in first side port 20 adjacent to tungsten filament 22. Electron repeller 25 is connected to a third electrical feedthrough 26, which is connected to first electrical feedthrough 23 to which voltage $V-\Delta V$ is applied. Thus, voltage $V-\Delta V$ is applied to electron repeller 25.

Skimmer 18 further includes an electron collector 27 constituted by a metal plate disposed in second side port 21. Electron collector 27 is connected to a fourth electrical feedthrough 28 which is grounded. Voltages V−ΔV and V+ΔV are selected such that tungsten filament 22 has a potential which is more negative than a potential of electron collector 27, which causes electron repeller 25 to repel the electrons emitted from tungsten filament 22 out of first side port 20 and causes electron collector plate 27 to attract the electrons emitted from tungsten filament 22 towards second side port 21.

As the electrons which are emitted from tungsten filament 22 travel out of first side port 20 towards second side port 21, they are also attracted towards first electrode 8 of ion lens 6 to which positive voltage +V1 is applied, enabling at least some of these electrons to pass through sample beam 16, which has an excess of positive ions as discussed above in connection with FIGS. 1–2. The electrons which pass through sample beam 16 reduce space charge repulsion between the positive ions in sample beam 16, thereby reducing space charge effects in sample beam 16 and producing a sample beam 29 having reduced space charge effects. The diagonal line between sample beam 16 and sample beam 29 having reduced space charge effects conceptually represents the transition from sample beam 16 to sample beam 29 having reduced space charge effects. The exact position of this transition is unclear; it could occur anywhere from the tip of skimmer cone 19 to the interior of first electrode 8 of ion lens 6.

Figure 4:
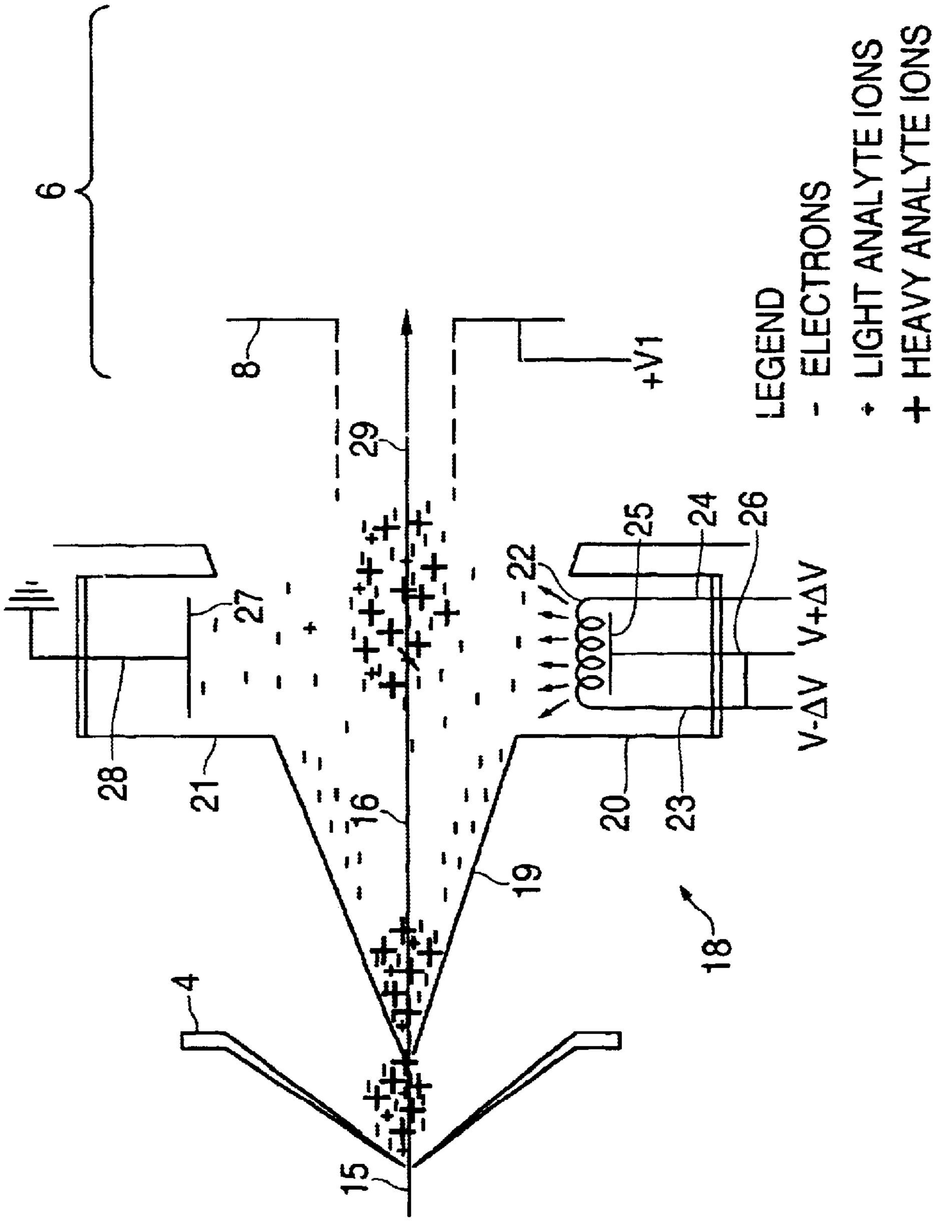
FIG. 4 is a diagram showing how the present invention reduces space charge effects in the mass spectrometer in FIG. 3.

FIG. 4 is a diagram showing how the present invention reduces space charge effects in the mass spectrometer in FIG. 3, wherein (−) denotes electrons, (+) denotes light analyte ions, such as Li, and (+) denotes heavy analyte ions, such as U. As shown in FIG. 4, the electrons (−) which diffuse away from sample beam 16 as it travels downstream from skimmer cone 19 towards ion lens 6 are replaced by electrons emitted from tungsten filament 22 which pass through sample beam 16 having an excess of positive ions. The electrons emitted from tungsten filament 22 which pass through sample beam 16 reduce space charge repulsion between the positive ions in sample beam 16, thereby reducing space charge effects in sample beam 16 and producing a sample beam 29 having reduced space charge effects. The electron current produced by tungsten filament 22 may also be adjusted to provide more electrons (−) than were in sample beam 16 initially.

Figure 2:
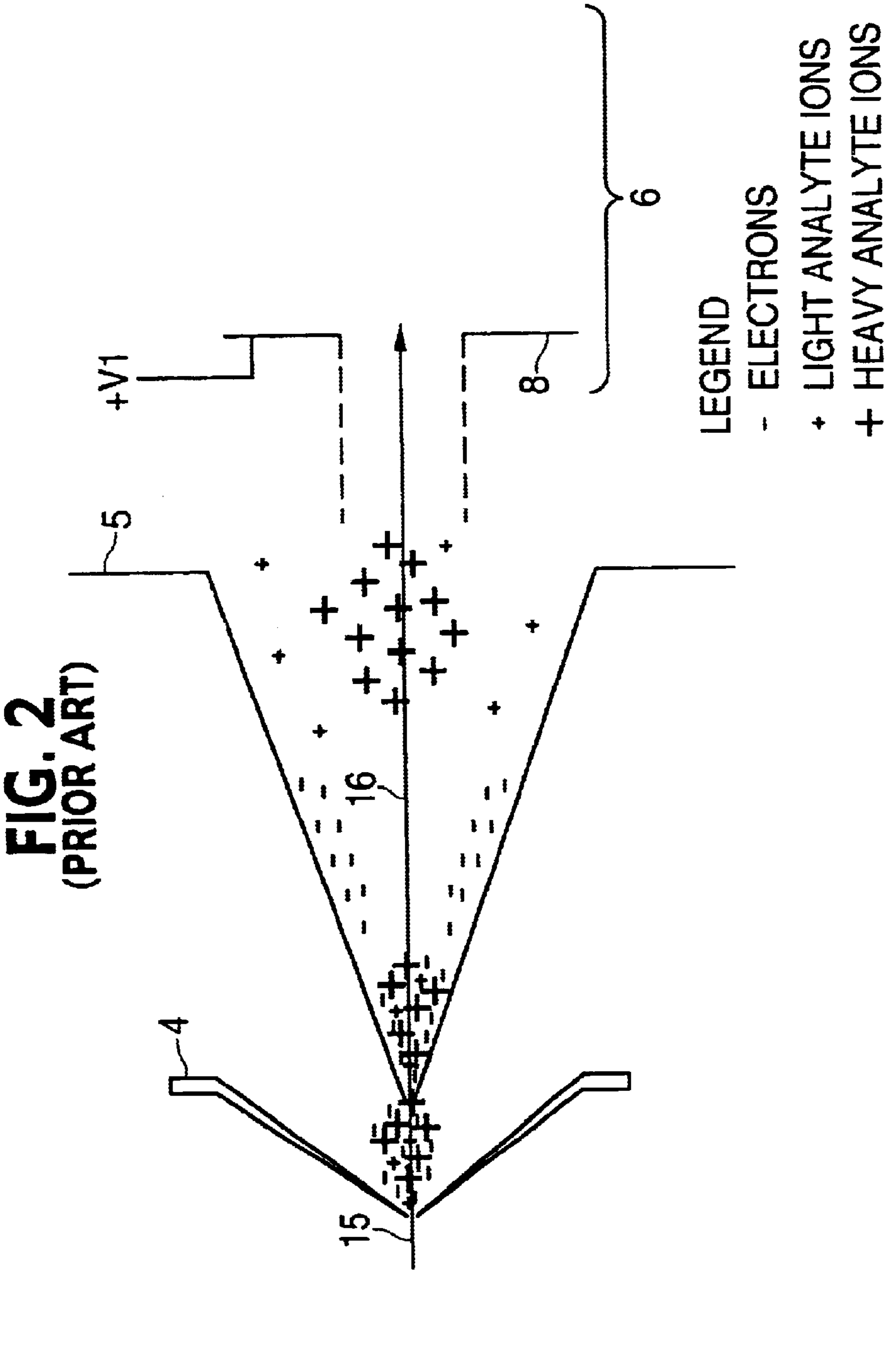
FIG. 2 (PRIOR ART)
FIG. 2 is a diagram showing space charge effects in the prior-art mass spectrometer in FIG. 1.

For the reasons discussed in detail in the Praphairaksit I and Praphairaksit II papers, this reduces the amount that sample beam 29 having reduced space charge effects defocuses as it travels downstream from skimmer cone 19 towards ion lens 6 in comparison with sample beam 16 in FIG. 2, increasing the number of the light analyte ions (+) and the heavy analyte ions (+) which are available to enter first electrode 8 of ion lens 6 in comparison with sample beam 16 in FIG. 2. Also, this reduces the difference between the extent of defocusing of the light analyte ions (+) and the extent of defocusing of the heavy analyte ions (+) in comparison with sample beam 16 in FIG. 2, such that the ratio of the abundance (or number density) of the light analyte ions (+) to the abundance of the heavy analyte ions (+) in the portion of sample beam 29 having reduced space charge effects which actually enters first electrode 8 of ion lens 6 is closer to the actual ratio of the abundance of the light analyte ions (+) to the abundance of the heavy analyte ions (+) in sample beam 16 where it enters skimmer 18.

The reduction in space charge effects achieved in the mass spectrometer in FIG. 3 provides substantial improvements in the performance of the mass spectrometer in FIG. 3 in comparison with the prior-art mass spectrometer in FIG. 1.

The operation of the mass spectrometer in FIG. 3, the manner in which space charge effects are reduced in the mass spectrometer in FIG. 3, and the improvements in the performance of the mass spectrometer in FIG. 3 in comparison with the prior-art mass spectrometer in FIG. 1 are described in detail in the Praphairaksit I and Praphairaksit II papers.

Sampler 4 and skimmer cone 19 in FIG. 3 may be grounded, or they may be isolated from ground and left floating, or they may have a voltage applied thereto.

Skimmer cone 19 in FIG. 3 may be omitted, in which case positive voltage +V1 applied to first electrode 8 of ion lens 6 is a voltage that is more positive than a potential of sampler 4.

Skimmer cone 19, first side port 20, and second side port 21 in FIG. 3 need not be together in a single piece as shown in FIG. 3. For example, first side port 20 and second side port 21 may be together in a single piece that supports skimmer cone 19. Such a two-piece assembly may be shorter than the one-piece assembly of skimmer cone 19, first side port 20, and second side port 21 shown in FIG. 3.

Although electron collector 27 in FIG. 3 is grounded via electrical feedthrough 28, it may alternatively be connected to a potential that is more positive than the potential of tungsten filament 22.

Filament 22 in FIG. 3 need not be made of tungsten, but may be made of other metals or alloys as is well known in the art.

Although the example in FIG. 3 shows emitting electrons to be added to sample beam 16 between skimmer 18 and ion lens 6, the present invention is not limited to emitting electrons at such a position, but may emit electrons to be added to sample beam 16 at any suitable location between sampler 4 and mass analyzer 3.

Although the example in FIG. 3 uses an ion lens 6 which is a collection of DC electrodes, the present invention is not limited to the use of such an ion lens, but may use any suitable ion optical device which is capable of collecting ions from sample beam 16, focusing the collected ions, and transmitting the focused ions to mass analyzer 3, such as a DC multipole ion lens such as a quadrupole ion lens, or an AC multipole ion guide such as a quadrupole ion guide, a hexapole ion guide, an octopole ion guide, or an ion guide with more than eight poles, all of which are well known in the art.

Ion source 1 in FIG. 3 may be an inductively coupled plasma ion source, an electrospray ion source, or an ion spray ion source, all of which are well known in the art, or any ion source in which ions are extracted from a plasma, or any other suitable source of positive ions, negative ions, neutral atoms, neutral molecules, or aerosol particles.

The present invention has been described above as using an ion source 1 which generates a quasineutral beam 15 of positive ions and electrons wherein the total positive charge of the positive ions is substantially equal to the total negative charge of the electrons. However, some ion sources, such as an electrospray ion source and an ion spray ion source which are known in the art as discussed above, do not generate a quasineutral beam, but generate a positively charged beam with an excess of positive ions. The present invention may also use an ion source which generates such a positively charged beam.

Mass analyzer 3 in FIG. 3 may be a quadrupole mass analyzer, a magnetic sector mass analyzer, a time-of-flight mass analyzer, a quadrupole ion trap mass analyzer, all of which are well known in the art, or any other suitable mass analyzer.

The prior-art mass spectrometer in FIG. 1 and the mass spectrometer in FIG. 3 include an ion lens in which a positive voltage is applied to a first electrode of the ion lens, meaning a voltage that is more positive than a potential of a skimmer. Examples of commercially available ICP-MS instruments which include this type of ion lens are the PerkinElmer SCIEX ELAN 6000 and 6100, and the Agilent 4500 and 7500 when used in the so-called "soft extraction mode".

When an electron source according to the present invention as exemplified by tungsten filament 22 in FIG. 3 is used in a mass spectrometer including this type of ion lens in the configuration shown in FIG. 3, electrons emitted from the electron source are attracted towards the first electrode of the ion lens to which the positive voltage is applied, enabling at least some of these electrons to pass through a sample beam having an excess of positive ions, which reduces space charge repulsion between the positive ions in the sample beam, thereby reducing space charge effects in the sample beam and producing a sample beam having reduced space charge effects as discussed above in connection with FIGS. 3–4.

However, most of the commercially available ICP-MS instruments include an ion lens in which a negative voltage is applied to a first electrode of the ion lens, meaning a voltage that is more negative than a potential of a skimmer. Examples of commercially available ICP-MS instruments which include this type of ion lens are the Agilent 4500 and 7500 when used in the so-called "normal extraction mode", the VG PlasmaQuad 3, the VG PQ ExCell, the VG Axiom, the Finnigan MAT Element, the Micromass Platform, the Micromass IsoProbe, and the Varian UltraMass.

If an electron source according to the present invention as exemplified by tungsten filament 22 in FIG. 3 were to be used in a mass spectrometer including this type of ion lens in the configuration shown in FIG. 3, electrons emitted from the electron source would be repelled by the first electrode of the ion lens to which the negative voltage is applied, substantially preventing these electrons from passing through a sample beam having an excess of positive ions, which would make it substantially impossible to reduce space charge repulsion between the positive ions in the sample beam, thereby making it substantially impossible to reduce space charge effects in the sample beam and produce a sample beam having reduced space charge effects as discussed above in connection with FIGS. 3–4.

Therefore, in order to be able to effectively use an electron source according to the present invention in a mass spectrometer including the type of ion lens in which a negative voltage is applied to a first electrode of the ion lens, it is necessary to dispose the electron source at a position that will enable electrons emitted from the electron source to pass through a sample beam having an excess of positive ions as discussed above in connection with FIGS. 3–4.

Figure 5:
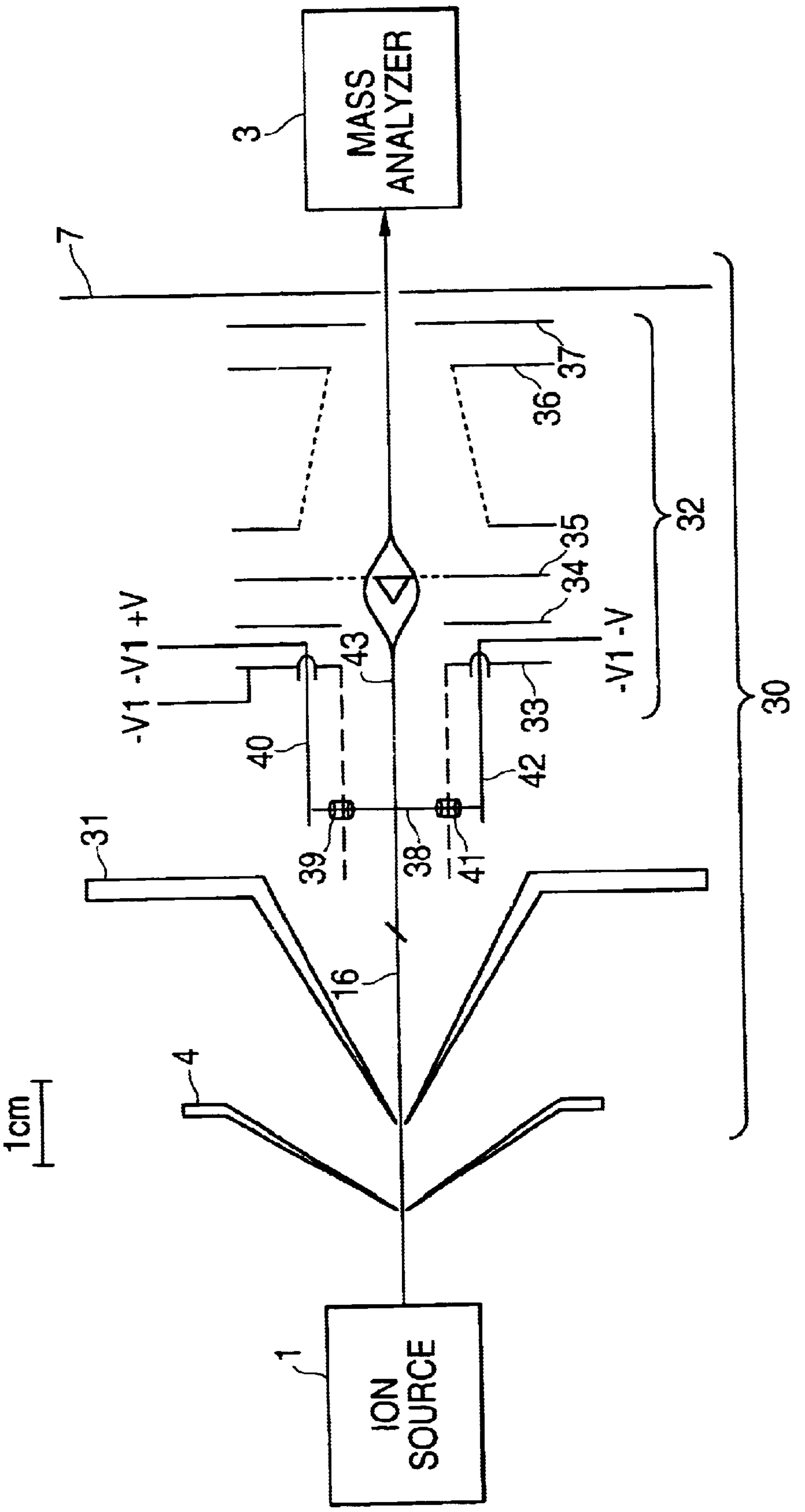
FIG. 5 shows another example of a mass spectrometer according to the present invention in which a voltage that is more negative than a potential of a skimmer is applied to a first electrode of an ion lens.

FIG. 5 shows an example of a mass spectrometer according to the present invention including an ion lens in which a negative voltage is applied to a first electrode of the ion lens.

The mass spectrometer in FIG. 5 includes an ion source 1, a sampling interface 30, and a mass analyzer 3.

Sampling interface 30 includes a sampler 4, a skimmer 31, an ion lens 32, and a differential pumping plate 7. Ion lens 32 includes four electrodes 33, 34, 36, and 37 and a photon stop 35. A negative voltage −V1 is applied to a first electrode 33 of ion lens 32, meaning a voltage that is more negative than a potential of skimmer 31. One or more additional ion lenses may be disposed between ion lens 32 and differential pumping plate 7.

First electrode 33 may be a cylindrical electrode having holes in it as indicated by the dashed lines in FIG. 5, and may be formed of a mesh.

A tungsten filament 38 constituting an electron source according to the present invention is disposed inside first electrode 33 of ion lens 32. A first end of tungsten filament 38 passes through a first ceramic insulator or clearance hole 39 and is connected to a first electrical feedthrough 40 to which a voltage −V1+V is applied. A second end of tungsten filament 38 passes through a second ceramic insulator or clearance hole 41 and is connected to a second electrical feedthrough 42 to which a voltage −V−V is applied. Voltages −V1+V and −V1−V cause a current to flow through tungsten filament 38, which causes tungsten filament 38 to emit electrons. Voltages −V1+V and −V1−V are preferably small enough that the electrons which are emitted from tungsten filament 38 do not have enough energy to create additional ions in sample beam 16. However, voltages −V1+V and −V1−V may also be adjusted to enhance production of ions from atoms or molecules extracted from ion source 1 inside skimmer 31 and/or first electrode 33 of ion lens 32, if desired.

As the electrons are emitted from tungsten filament 38, they are repelled by first electrode 33 of ion lens 32 to which negative voltage -V is applied out of first electrode 33 of ion lens 32 upstream towards skimmer 31. As these electrons travel upstream towards skimmer 31, at least some of these electrons pass through sample beam 16, which has an excess of positive ions as discussed above in connection with FIGS. 1–2. The electrons which pass through sample beam 16 reduce space charge repulsion between the positive ions in sample beam 16, thereby reducing space charge effects in sample beam 16 and producing a sample beam 43 having reduced space charge effects. The diagonal line between sample beam 16 and sample beam 43 having reduced space charge effects conceptually represents the transition from sample beam 16 to sample beam 43 having reduced space charge effects. The exact position of this transition is unclear; it could occur anywhere from the tip of skimmer 31 to the interior of first electrode 33 of ion lens 32.

The reduction in space charge effects achieved in the mass spectrometer in FIG. 5 provides substantial improvements in the performance of the mass spectrometer in FIG. 5 in comparison with the prior-art mass spectrometer in FIG. 1.

The operation of the mass spectrometer in FIG. 5, the manner in which space charge effects are reduced in the mass spectrometer in FIG. 5, and the improvements in the performance of the mass spectrometer in FIG. 5 in comparison with the prior-art mass spectrometer in FIG. 1 are described in detail in the Praphairaksit III paper.

Sampler 4 and skimmer 31 in FIG. 5 may be grounded, or they may be isolated from ground and left floating, or they may have a voltage applied thereto.

Skimmer 31 in FIG. 5 may be omitted, in which case negative voltage −V1 applied to first electrode 33 of ion lens 32 is a voltage that is more negative than a potential of sampler 4.

Filament 38 in FIG. 5 need not be made of tungsten, but may be made of other metals or alloys as is well known in the art.

Filament 38 in FIG. 5 need not be disposed inside first electrode 33 as shown in FIG. 5, but may be disposed outside first electrode 33, for example, in the position of first electrical feedthrough 40 or second electrical feedthrough 42 in FIG. 5, as long as the relevant voltages are adjusted so that electrons emitted from filament 38 can enter first electrode 33 through the holes in first electrode 33.

Although the example in FIG. 5 shows emitting electrons to be added to sample beam 16 at the position of first electrode 33, the present invention is not limited to emitting electrons at such a position, but may emit electrons to be added to sample beam 16 at any suitable location between sampler 4 and mass analyzer 3.

Although the example in FIG. 5 uses an ion lens 32 which is a collection of DC electrodes, the present invention is not limited to the use of such an ion lens, but may use any suitable ion optical device which is capable of collecting ions from sample beam 16, focusing the collected ions, and transmitting the focused ions to mass analyzer 3, such as a DC multipole ion lens such as a quadrupole ion lens, or an AC multipole ion guide such as a quadrupole ion guide, a hexapole ion guide, an octopole ion guide, or an ion guide with more than eight poles, all of which are well known in the art.

Ion source 1 in FIG. 5 may be an inductively coupled plasma ion source, an electrospray ion source, or an ion spray ion source, all of which are well known in the art, or any ion source in which ions are extracted from a plasma, or any other suitable source of positive ions, negative ions, neutral atoms, neutral molecules, or aerosol particles.

The present invention has been described above as using an ion source 1 which generates a quasineutral beam 15 of positive ions and electrons wherein the total positive charge of the positive ions is substantially equal to the total negative charge of the electrons. However, some ion sources, such as an electrospray ion source and an ion spray ion source which are known in the art as discussed above, do not generate a quasineutral beam, but generate a positively charged beam with an excess of positive ions. The present invention may also use an ion source which generates such a positively charged beam.

Mass analyzer 3 in FIG. 5 may be a quadrupole mass analyzer, a magnetic sector mass analyzer, a time-of-flight mass analyzer, a quadrupole ion trap mass analyzer, all of which are well known in the art, or any other suitable mass analyzer.

While the electron source according to the present invention has been described as being for use in mass spectrometers for chemical analysis, it may also be used in any ion apparatus in which space charge effects occur in a sample beam due to an excess of positive ions in the sample beam, such as an isotope separation apparatus, an ion implantation apparatus, or an ion deposition apparatus.

While the electron source according to the present invention has been described as being for use in an apparatus including an ion source which generates a quasineutral beam of positive ions and electrons, it may also be used in any apparatus including a source which generates a charged beam having an imbalance between positive charge carriers and negative charge carriers, and a sampling interface which extracts a portion of the charged beam from the source to form a sample beam that travels along a path and has an imbalance between positive charge carriers and negative charge carriers over at least part of the path, thereby causing space charge effects to occur in the sample beam due to the imbalance between positive charge carriers and negative charge carriers in the sample beam. The electron source according to the present invention may be used in such an apparatus to add electrons to the sample beam to improve properties of the sample beam, thereby producing a sample beam having improved properties.

For example, in such an apparatus, space charge repulsion occurs in the sample beam due to the imbalance between positive charge carriers and negative charge carriers in the sample beam, and the electron source according to the present invention may be used in such an apparatus to add electrons to the sample beam to reduce or enhance the space charge repulsion in the sample beam, thereby improving properties of the sample beam and producing a sample beam having improved properties.

While several examples of the present invention have been described in some detail, it will be appreciated by one of ordinary skill in the art that these examples are susceptible of many modifications. The present invention encompasses all such modifications, and the scope of the present invention is to be determined solely by reference to the appended claims.

We claim:

1. A mass spectrometer comprising:

an ion source which generates a beam including positive ions;

a sampling interface which extracts a portion of the beam from the ion source to form a sample beam that travels along a path and has an excess of positive ions over at least part of the path, thereby causing space charge effects to occur in the sample beam due to the excess of positive ions in the sample beam;

an electron source which adds electrons to the sample beam to reduce the excess of positive ions in the sample beam, thereby reducing the space charge effects in the sample beam and producing a sample beam having reduced space charge effects; and a mass analyzer which analyzes the sample beam having reduced space charge effects.

2. A mass spectrometer comprising:

an ion source which generates a quasineutral beam of positive ions and electrons wherein a total positive charge of the positive ions is substantially equal to a total negative charge of the electrons;

a sampling interface which extracts a portion of the quasineutral beam from the ion source to form a sample beam that travels along a path and is initially a quasineutral sample beam of positive ions and electrons wherein a total positive charge of the positive ions is substantially equal to a total negative charge of the electrons, but changes to a positively charged sample beam with an excess of positive ions as the sample beam travels along the path, thereby causing space charge effects to develop in the positively charged sample beam due to the excess of positive ions in the positively charged sample beam as the sample travels along the path;

an electron source which adds electrons to the positively charged sample beam to reduce the excess of positive ions in the positively charged sample beam, thereby reducing the space charge effects in the positively charged sample beam and producing a sample beam having reduced space charge effects; and a mass analyzer which analyzes the sample beam having reduced space charge effects.

3. A mass spectrometer according to claim 2, wherein the ion source is an inductively coupled plasma (ICP) ion source.

4. A mass spectrometer according to claim 2, wherein the sampling interface includes:

a sampler; and a skimmer disposed downstream from the sampler along the path of the sample beam.

5. A mass spectrometer according to claim 4, wherein the electron source adds electrons to the positively charged sample beam at a position between the sampler and the mass analyzer.

6. A mass spectrometer according to claim 4, wherein the sampling interface further includes an ion lens disposed downstream from the skimmer along the path of the sample beam;

wherein the ion lens includes at least one electrode, the at least one electrode including a first electrode nearest to the skimmer, the first electrode having applied thereto a voltage that is more positive than a potential of the skimmer;

wherein the sample beam changes from the quasineutral sample beam to the positively charged sample beam between the skimmer and the first electrode of the ion lens; and wherein the electron source emits the electrons to be added to the positively charged sample beam between the skimmer and the first electrode of the ion lens.

7. A mass spectrometer according to claim 4, wherein the sampling interface further includes an ion lens disposed downstream from the skimmer along the path of the sample beam;

wherein the ion lens includes at least one electrode, the at least one electrode including a first electrode nearest to the skimmer, the first electrode having applied thereto a voltage that is more negative than a potential of the skimmer;

wherein the sample beam changes from the quasineutral sample beam to the positively charged sample beam between the skimmer and the first electrode of the ion lens; and wherein the electron source emits the electrons to be added to the positively charged sample beam at a position which enables the electrons to pass through the positively charged sample beam.

8. A mass spectrometer according to claim 7, wherein the electron source emits the electrons to be added to the positively charged sample beam inside the first electrode of the ion lens.

9. A mass spectrometer according to claim 2, wherein the sampling interface includes a sampler.

10. A mass spectrometer according to claim 9, wherein the electron source adds electrons to the positively charged sample beam at a position between the sampler and the mass analyzer.

11. A mass spectrometer according to claim 9, wherein the sampling interface further includes an ion lens disposed downstream from the sampler along the path of the sample beam;

wherein the ion lens includes at least one electrode, the at least one electrode including a first electrode nearest to the sampler, the first electrode having applied thereto a voltage that is more positive than a potential of the sampler;

wherein the sample beam changes from the quasineutral sample beam to the positively charged sample beam between the sampler and the first electrode of the ion lens; and wherein the electron source emits the electrons to be added to the positively charged sample beam between the sampler and the first electrode of the ion lens.

12. A mass spectrometer according to claim 9, wherein the sampling interface further includes an ion lens disposed downstream from the sampler along the path of the sample beam;

wherein the ion lens includes at least one electrode, the at least one electrode including a first electrode nearest to the sampler, the first electrode having applied thereto a voltage that is more negative than a potential of the sampler;

wherein the sample beam changes from the quasineutral sample beam to the positively charged sample beam between the sampler and the first electrode of the ion lens; and wherein the electron source emits the electrons to be added to the positively charged sample beam at a position which enables the electrons to pass through the positively charged sample beam.

13. A mass spectrometer according to claim 12, wherein the electron source emits the electrons to be added to the positively charged sample beam inside the first electrode of the ion lens.

14. A mass spectrometer comprising:

a source which generates a charged beam having an imbalance between positive charge carriers and negative charge carriers;

a sampling interface which extracts a portion of the charged beam from the source to form a sample beam that travels along a path and has an imbalance between positive charge carriers and negative charge carriers over at least part of the path, thereby causing space charge effects to occur in the sample beam due to the imbalance between positive charge carriers and negative charge carriers in the sample beam;

an electron source which adds electrons to the sample beam to improve properties of the sample beam, thereby producing a sample beam having improved properties; and a mass analyzer which analyzes the sample beam having improved properties.

15. A mass spectrometer according to claim 14, wherein space charge repulsion occurs in the sample beam due to the imbalance between positive charge carriers and negative charge carriers in the sample beam; and wherein the electron source adds the electrons to the sample beam to reduce or enhance the space charge repulsion in the sample beam, thereby improving the properties of the sample beam and producing the sample beam having improved properties.

16. A mass spectrometer according to claim 14, wherein the source is an electrospray ion source.

17. A mass spectrometer according to claim 14, wherein the source is an ion spray ion source.

18. A mass spectrometer according to claim 14, wherein the sampling interface includes:

a sampler; and a skimmer disposed downstream from the sampler along the path of the sample beam.

19. A mass spectrometer according to claim 18, wherein the electron source adds electrons to the sample beam at a position between the sampler and the mass analyzer.

20. A mass spectrometer according to claim 18, wherein the sampling interface further includes an ion lens disposed downstream from the skimmer along the path of the sample beam;

wherein the ion lens includes at least one electrode, the at least one electrode including a first electrode nearest to the skimmer, the first electrode having applied thereto a voltage that is more positive than a potential of the skimmer; and wherein the electron source emits the electrons to be added to the sample beam between the skimmer and the first electrode of the ion lens.

21. A mass spectrometer according to claim 18, wherein the sampling interface further includes an ion lens disposed downstream from the skimmer along the path of the sample beam;

wherein the ion lens includes at least one electrode, the at least one electrode including a first electrode nearest to the skimmer, the first electrode having applied thereto a voltage that is more negative than a potential of the skimmer; and wherein the electron source emits the electrons to be added to the sample beam at a position which enables the electrons to pass through the sample beam.

22. A mass spectrometer according to claim 21, wherein the electron source emits the electrons to be added to the sample beam inside the first electrode of the ion lens.

23. A mass spectrometer according to claim 14, wherein the sampling interface includes a sampler.

24. A mass spectrometer according to claim 23, wherein the electron source adds electrons to the sample beam at a position between the sampler and the mass analyzer.

25. A mass spectrometer according to claim 23, wherein the sampling interface further includes an ion lens disposed downstream from the sampler along the path of the sample beam;

wherein the ion lens includes at least one electrode, the at least one electrode including a first electrode nearest to the sampler, the first electrode having applied thereto a voltage that is more positive than a potential of the sampler; and wherein the electron source emits the electrons to be added to the sample beam between the sampler and the first electrode of the ion lens.

26. A mass spectrometer according to claim 23, wherein the sampling interface further includes an ion lens disposed downstream from the sampler along the path of the sample beam;

wherein the ion lens includes at least one electrode, the at least one electrode including a first electrode nearest to the sampler, the first electrode having applied thereto a voltage that is more negative than a potential of the sampler; and wherein the electron source emits the electrons to be added to the sample beam at a position which enables the electrons to pass through the sample beam.

27. A mass spectrometer according to claim 26, wherein the electron source emits the electrons to be added to the sample beam inside the first electrode of the ion lens.

28. A mass spectrometer according to claim 14, wherein the sampling interface includes:

a sampler; and an ion optical device disposed downstream from the sampler along the path of the sample beam;

wherein the ion optical device collects ions from the sample beam, focuses the collected ions, and transmits the focused ions to the mass analyzer.

29. A mass spectrometer according to claim 28, wherein the electron source adds electrons to the sample beam at a position between the sampler and the mass analyzer.

30. A mass spectrometer according to claim 28, wherein the sampling interface further includes a skimmer disposed between the sampler and the ion optical device along the path of the sample beam.

31. A mass spectrometer according to claim 28, wherein the ion optical device includes an ion lens.

32. A mass spectrometer according to claim 28, wherein the ion optical device includes a DC multipole ion lens.

33. A mass spectrometer according to claim 28, wherein the ion optical device includes an AC multipole ion guide.

34. A mass spectrometry method comprising the steps of:

generating a beam including positive ions with an ion source;

extracting a portion of the beam from the ion source with a sampling interface to form a sample beam that travels along a path and has an excess of positive ions over at least part of the path, thereby causing space charge effects to occur in the sample beam due to the excess of positive ions in the sample beam;

adding electrons from an electron source to the sample beam to reduce the excess of positive ions in the sample beam, thereby reducing the space charge effects in the sample beam and producing a sample beam having reduced space charge effects; and mass-analyzing the sample beam having reduced space charge effects with a mass analyzer.

35. A mass spectrometry method comprising the steps of:

generating a quasineutral beam of positive ions and electrons with an ion source wherein a total positive charge of the positive ions is substantially equal to a total negative charge of the electrons;

extracting a portion of the quasineutral beam from the ion source with a sampling interface to form a sample beam that travels along a path and is initially a quasineutral sample beam of positive ions and electrons wherein a total positive charge of the positive ions is substantially equal to a total negative charge of the electrons, but changes to a positively charged sample beam with an excess of positive ions as the sample beam travels along the path, thereby causing space charge effects to develop in the positively charged sample beam due to the excess of positive ions in the positively charged sample beam as the sample travels along the path;

adding electrons from an electron source to the positively charged sample beam to reduce the excess of positive ions in the positively charged sample beam, thereby reducing the space charge effects in the positively charged sample beam and producing a sample beam having reduced space charge effects; and mass-analyzing the sample beam having reduced space charge effects with a mass analyzer.

36. A mass spectrometry method according to claim 35, wherein the ion source is an inductively coupled plasma (ICP) ion source.

37. A mass spectrometry method according to claim 35, wherein the sampling interface includes:

a sampler; and a skimmer disposed downstream from the sampler along the path of the sample beam.

38. A mass spectrometry method according to claim 37, wherein the electrons from the electron source are added to the positively charged sample beam at a position between the sampler and the mass analyzer.

39. A mass spectrometry method according to claim 37, wherein the sampling interface further includes an ion lens disposed downstream from the skimmer along the path of the sample beam;

wherein the ion lens includes at least one electrode, the at least one electrode including a first electrode nearest to the skimmer, the first electrode having applied thereto a voltage that is more positive than a potential of the skimmer;

wherein the sample beam changes from the quasineutral sample beam to the positively charged sample beam between the skimmer and the first electrode of the ion lens; and wherein the electron source emits the electrons which are added to the positively charged sample beam between the skimmer and the first electrode of the ion lens.

40. A mass spectrometry method according to claim 37, wherein the sampling interface further includes an ion lens disposed downstream from the skimmer along the path of the sample beam;

wherein the ion lens includes at least one electrode, the at least one electrode including a first electrode nearest to the skimmer, the first electrode having applied thereto a voltage that is more negative than a potential of the skimmer;

wherein the sample beam changes from the quasineutral sample beam to the positively charged sample beam between the skimmer and the first electrode of the ion lens; and wherein the electron source emits the electrons which are added to the positively charged sample beam at a position which enables the electrons to pass through the positively charged sample beam.

41. A mass spectrometry method according to claim 40, wherein the electron source emits the electrons which are added to the positively charged sample beam inside the first electrode of the ion lens.

42. A mass spectrometry method according to claim 35, wherein the sampling interface includes a sampler.

43. A mass spectrometry method according to claim 42, wherein the electrons from the electron source are added to the positively charged sample beam at a position between the sampler and the mass analyzer.

44. A mass spectrometry method according to claim 42, wherein the sampling interface further includes an ion lens disposed downstream from the sampler along the path of the sample beam;

wherein the ion lens includes at least one electrode, the at least one electrode including a first electrode nearest to the sampler, the first electrode having applied thereto a voltage that is more positive than a potential of the sampler;

wherein the sample beam changes from the quasineutral sample beam to the positively charged sample beam between the sampler and the first electrode of the ion lens; and wherein the electron source emits the electrons which are added to the positively charged sample beam between the sampler and the first electrode of the ion lens.

45. A mass spectrometry method according to claim 42, wherein the sampling interface further includes an ion lens disposed downstream from the sampler along the path of the sample beam;

wherein the ion lens includes at least one electrode, the at least one electrode including a first electrode nearest to the sampler, the first electrode having applied thereto a voltage that is more negative than a potential of the sampler;

wherein the sample beam changes from the quasineutral sample beam to the positively charged sample beam between the sampler and the first electrode of the ion lens; and wherein the electron source emits the electrons which are added to the positively charged sample beam at a position which enables the electrons to pass through the positively charged sample beam.

46. A mass spectrometry method according to claim 45, wherein the electron source emits the electrons which are added to the positively charged sample beam inside the first electrode of the ion lens.

47. A mass spectrometry method comprising the steps of:

generating a charged beam having an imbalance between positive charge carriers and negative charge carriers with a source;

extracting a portion of the charged beam from the source with a sampling interface to form a sample beam that travels along a path and has an imbalance between positive charge carriers and negative charge carriers over at least part of the path, thereby causing space charge effects to occur in the sample beam due to the imbalance between positive charge carriers and negative charge carriers in the sample beam;

adding electrons from an electron source to the sample beam to improve properties of the sample beam, thereby producing a sample beam having improved properties; and mass-analyzing the sample beam having improved properties with a mass analyzer.

48. A mass spectrometry method according to claim 47, wherein space charge repulsion occurs in the sample beam due to the imbalance between positive charge carriers and negative charge carriers in the sample beam; and wherein the electrons from the electron source which are added to the sample beam reduce or enhance the space charge repulsion in the sample beam, thereby improving the properties of the sample beam and producing the sample beam having improved properties.

49. A mass spectrometry method according to claim 47, wherein the source is an electrospray ion source.

50. A mass spectrometry method according to claim 47, wherein the source is an ion spray ion source.

51. A mass spectrometry method according to claim 47, wherein the sampling interface includes:

a sampler; and a skimmer disposed downstream from the sampler along the path of the sample beam.

52. A mass spectrometry method according to claim 51, wherein the electrons from the electron source are added to the sample beam at a position between the sampler and the mass analyzer.

53. A mass spectrometry method according to claim 51, wherein the sampling interface further includes an ion lens disposed downstream from the skimmer along the path of the sample beam;

wherein the ion lens includes at least one electrode, the at least one electrode including a first electrode nearest to the skimmer, the first electrode having applied thereto a voltage that is more positive than a potential of the skimmer; and wherein the electron source emits the electrons which are added to the sample beam between the skimmer and the first electrode of the ion lens.

54. A mass spectrometry method according to claim 51, wherein the sampling interface further includes an ion lens disposed downstream from the skimmer along the path of the sample beam;

wherein the ion lens includes at least one electrode, the at least one electrode including a first electrode nearest to the skimmer, the first electrode having applied thereto a voltage that is more negative than a potential of the skimmer; and wherein the electron source emits the electrons which are added to the sample beam at a position which enables the electrons to pass through the sample beam.

55. A mass spectrometry method according to claim 54, wherein the electron source emits the electrons which are added to the sample beam inside the first electrode of the ion lens.

56. A mass spectrometry method according to claim 47, wherein the sampling interface includes a sampler.

57. A mass spectrometry method according to claim 56, wherein the electrons from the electron source are added to the sample beam at a position between the sampler and the mass analyzer.

58. A mass spectrometry method according to claim 56, wherein the sampling interface further includes an ion lens disposed downstream from the sampler along the path of the sample beam;

wherein the ion lens includes at least one electrode, the at least one electrode including a first electrode nearest to the sampler, the first electrode having applied thereto a voltage that is more positive than a potential of the sampler; and wherein the electron source emits the electrons which are added to the sample beam between the sampler and the first electrode of the ion lens.

59. A mass spectrometry method according to claim 56, wherein the sampling interface further includes an ion lens disposed downstream from the sampler along the path of the sample beam;

wherein the ion lens includes at least one electrode, the at least one electrode including a first electrode nearest to the sampler, the first electrode having applied thereto a voltage that is more negative than a potential of the sampler; and wherein the electron source emits the electrons which are added to the sample beam at a position which enables the electrons to pass through the sample beam.

60. A mass spectrometry method according to claim 59, wherein the electron source emits the electrons which are added to the sample beam inside the first electrode of the ion lens.

61. A mass spectrometry method according to claim 47, wherein the sampling interface includes:

a sampler; and an ion optical device disposed downstream from the sampler along the path of the sample beam;

wherein the ion optical device collects ions from the sample beam, focuses the collected ions, and transmits the focused ions to the mass analyzer.

62. A mass spectrometry method according to claim 61, wherein the electrons from the electron source are added to the sample beam at a position between the sampler and the mass analyzer.

63. A mass spectrometry method according to claim 61, wherein the sampling interface further includes a skimmer disposed between the sampler and the ion optical device along the path of the sample beam.

64. A mass spectrometry method according to claim 61, wherein the ion optical device includes an ion lens.

65. A mass spectrometry method according to claim 61, wherein the ion optical device includes a DC multipole ion lens.

66. A mass spectrometry method according to claim 61, wherein the ion optical device includes an AC multipole ion guide.

* * * * *